United States Patent
Hartig et al.

(10) Patent No.: US 6,787,003 B2
(45) Date of Patent: Sep. 7, 2004

(54) SPUTTERING TARGET AND METHODS OF MAKING AND USING SAME

(75) Inventors: Klaus Hartig, Avcoa, WI (US); Johan Vanderstraeten, Drongen (BE)

(73) Assignee: N.V. Bekaert S.A., Zwevegem (BE)

( * ) Notice: Subject to any disclaimer, the term of this patent is extended or adjusted under 35 U.S.C. 154(b) by 6 days.

(21) Appl. No.: 10/148,464

(22) PCT Filed: Dec. 1, 2000

(86) PCT No.: PCT/US00/42533

§ 371 (c)(1),
(2), (4) Date: May 31, 2002

(87) PCT Pub. No.: WO01/42522

PCT Pub. Date: Jun. 14, 2001

(65) Prior Publication Data

US 2002/0192390 A1 Dec. 19, 2002

Related U.S. Application Data

(60) Provisional application No. 60/168,965, filed on Dec. 3, 1999.

(51) Int. Cl.[7] .......................... C23C 14/34; C23C 4/08; B05D 1/02
(52) U.S. Cl. ........................ 204/192.15; 204/192.22; 204/298.13; 427/421; 427/427; 427/455
(58) Field of Search ............... 204/192.15, 192.22, 204/298.12, 298.13; 427/421, 427, 455

(56) References Cited

U.S. PATENT DOCUMENTS

| 4,610,771 A | | 9/1986 | Gillery ................... 204/192.1 |
| 5,693,203 A | * | 12/1997 | Ohhashi et al. ........ 204/298.12 |
| 5,922,176 A | * | 7/1999 | Caskey .................. 204/192.12 |

FOREIGN PATENT DOCUMENTS

| DE | 33 18 828 A | 11/1984 | ............ C23C/15/00 |
| DE | 196 26 732 A | 1/1998 | ............ C23C/14/34 |
| WO | WO 92 20832 A | 11/1992 | ............ C23C/14/34 |
| WO | WO 99 58736 A | 11/1999 | ............ C23C/14/34 |

OTHER PUBLICATIONS

A. Bergman et al., "The Effect of Gravity and Temperature Gradiants on Precipitation Inimmiscible Alloys," Journal of Materials Science, Chapman and Hall Ltd., London, G.B., vol. 23, No. 5, 1988, pp. 1573–1579.

* cited by examiner

Primary Examiner—Steven Versteeg
(74) Attorney, Agent, or Firm—Foley & Lardner LLP

(57) ABSTRACT

A sputtering target may include: a) a backing adapted to be operatively connected to a sputter power source; and b) an outer layer of a sputterable material carried by the backing, the sputterable material including a mixture of zinc and a second metal having a melting point less than that of the zinc, the zinc and the second metal being present in the sputterable material in metallic form and arranged as discrete volumes of the second metal in a matrix of zinc so that the zinc and the second metal are present in the sputterable material in a substantially non-alloyed form.

22 Claims, 2 Drawing Sheets

SPUTTERING TARGET AND METHODS OF MAKING AND USING SAME

CROSS REFERENCE TO RELATED APPLICATIONS

The present application is a continuation of provisional U.S. patent application filed Dec. 3, 1999 and assigned Serial No. 60/168,965 the entire disclosure of which is incorporated herein by reference.

The present invention provides improved zinc sputtering targets of the type commonly used in depositing thin dielectric layers via sputtering, e.g., in the manufacture of low emissivity film stacks.

BACKGROUND OF THE INVENTION

Sputtered coatings of various materials are used in a wide variety of applications. One of the most common applications for thin sputtered films is in making thin optical films. For example, low emissivity films commonly applied to window glazings comprise a series of layers formed of metals and dielectrics such as metal oxides or nitrides. In most commercial production, such thin films are applied by sputtering a target of a specific material in a controlled atmosphere to produce the desired film composition. If a metal layer is being applied, (e.g., a layer of silver), the metal target will typically be sputtered in an inert atmosphere, such as argon. Metal oxide and nitride films can be applied either by sputtering a target of the desired oxide or nitride or by sputtering a metal target in the presence of oxygen or nitrogen and allowing that sputtered metal to react to form the desired oxide or nitride.

One metal oxide layer which is common in the formation of low emissivity coatings is zinc oxide. The popularity of zinc oxide in such film stacks can be attributed largely to the relatively high sputtering rate for zinc targets in an oxygenating atmosphere. This rapid sputtering rate speeds production, thereby reducing the cost of manufacturing the low emissivity film stack. One disadvantage of reactive sputtering of a zinc target to apply coating of ZnO, however, is the tendency of such targets to produce "fireflies." It is believed that these fireflies are particles of the zinc target which are knocked off during sputtering and are oxidized as they pass through the reactive gas. During optimal sputtering conditions, the zinc from the target is sputtered on almost an atom-by-atom basis, and such energized zinc atoms will react with the oxidizing atmosphere as they proceed toward the substrate to be coated. The larger particles associated with fireflies do not always oxidize and can land on the substrate as incompletely oxidized particles. Given the rather thin coatings used in low emissivity film stacks, such large particulate inclusions can have a noticeable adverse impact on the quality of the finished product.

The exact mechanism by which fireflies are created when sputtering a zinc target is not fully understood. While other target materials could also yield fireflies, in normal commercial production parameters this problem is significantly more pronounced with zinc targets. It has been theorized that zinc is more susceptible to this firefly phenomenon due to the relatively brittle, friable nature of zinc as opposed to other, more malleable materials. Zinc also fairly readily oxidizes, which may tend to cause a layer of zinc oxide to buildup on the target. This friability of the zinc, in combination with the formation of a thin crust of zinc oxide, may enhance the tendency of the target to shed larger particles rather than uniformly sputtering atomic zinc to yield a homogenous, carefully controlled film.

In U.S. Pat. No. 4,610,771 (the teachings of which are incorporated herein by reference), Gillery et al. suggest the use of a sputtering target which comprises an alloy of zinc and tin. Gillery et al. claim that this alloy yields a superior film, but focus fairly little on the nature of the target itself, other than stating that it is an alloy having a specified composition. Gillery et al. also focus on the use of zinc and tin to the exclusion of other combinations, pointing out that other possible materials to alloy with zinc (e.g. bismuth) are undesirable for various reasons.

SUMMARY OF THE INVENTION

The present invention provides a target for use in sputtering, a method of making such a target, and a method of depositing a film on a substrate. In accordance with one embodiment of the invention, a target comprises a backing adapted to be operatively connected to a sputtering power source and an outer layer of a sputterable material carried by the backing. This sputterable material comprises a mixture of zinc and a second metal having a melting point less than that of the zinc. The zinc and the second metal are present in the sputterable material in metallic form and are arranged as discrete volumes of the second metal in a matrix of zinc. In one preferred adaptation of this target, the second metal is selected from the group consisting of tin, bismuth and indium or alloys or admixtures thereof. The target desirably comprises no less than 80% zinc on a weight basis, and optimally comprises no less than 91% wt. zinc.

Another embodiment of the invention provides a method of forming a target for magnetron sputtering. In accordance with this method, a backing having an exterior surface is provided. Zinc metal and a second metal are simultaneously plasma sprayed to create an outer layer of a sputterable material carried by the backing. The second metal used in this method has a melting point less than that of the zinc. If so desired, the second metal may be selected from the group consisting of tin, bismuth, and indium or alloys or admixtures thereof. In one particularly preferred method, the zinc and the second metal are delivered from discrete sources, whereby the outer layer of sputterable material comprises discrete areas of the second metal in a matrix of zinc.

The present invention also provides a method of depositing a film on a substrate. In accordance with this method, a target is provided. This target comprises a backing and an outer layer of a sputterable material carried by the backing. The sputterable material comprises a mixture of zinc and a second metal having a melting point less than that of the zinc. The zinc and the second metal are present in the sputterable material in metallic form and arranged as discrete volumes of the second metal in a matrix of zinc. The target and a substrate are placed in a sputtering chamber and the target is connected to a power source. Power is applied to the target while maintaining in the sputtering chamber a reactive atmosphere comprising oxygen. This deposits on surface of the substrate a film comprising oxides of zinc and the second metal.

Preferably, sputtering of the target consumes the zinc and the discrete volumes of the second metal, thereby exposing areas of the second metal previously covered by zinc and exposing areas of zinc previously covered by the second metal.

DETAILED DESCRIPTION OF THE PREFERRED EMBODIMENTS

Sputtering targets typically take one of two forms—planar or rotatable. Planar targets tend to be relatively large, rectangular plates of the target material. Such plates are commonly physically attached to a conductive backing, which usually includes electrical connections for connecting the backing to a power supply. These backings may also include a cooling system and a magnet used to generate a magnetic field to hold the sputtering plasma in a predefined area, referred to as magnetron sputtering. Such planar targets are well known in the art and need not be discussed in detail here.

Figure 1:
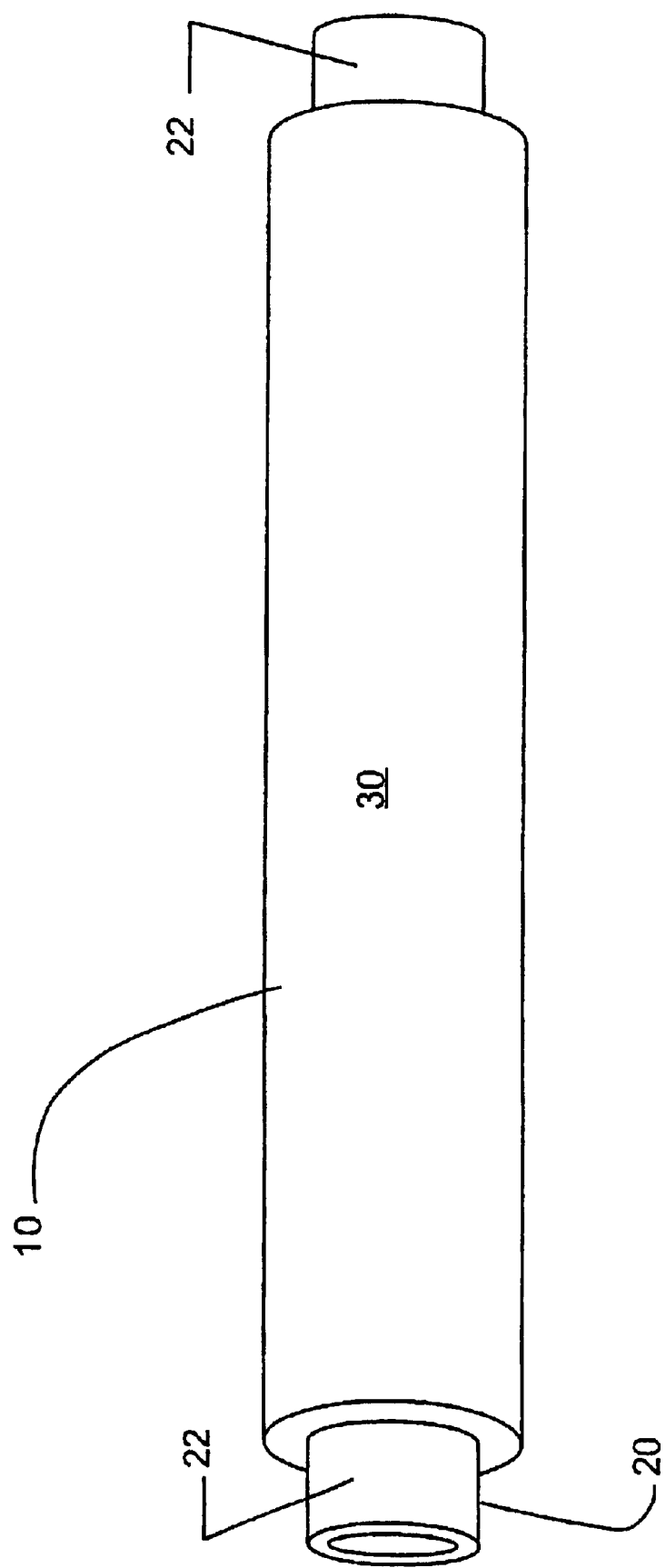
FIG. 1 is a schematic illustration of a rotatable target made in accordance with the present invention.

Rotatable targets are gaining increased acceptance in the commercial application of low emissivity films and the like. Rotatable targets typically take the form idealized in FIGS. 1 and 2. As shown in FIG. 1, the rotatable target 10 generally includes a conductive backing 20, which typically is formed of a stiff metal tube, e.g., a tube of stainless steel. The use of such a tubular backing permits a magnet to be positioned within the interior of the target, permitting the shape of the charged plasma adjacent the surface of the target to be more carefully controlled.

An outer layer 30 of a sputterable material will be carried by this backing 20. The outer layer 30 may extend laterally from one end of the tube to the other. More commonly though, a short length of the backing 20 extends laterally beyond the edges of the outer layer to enable the target to be mounted in a bay of a sputtering chamber. In most commercially available sputtering chambers, the sputtering chamber is provided with pairs of opposed end blocks, with one end block being used to hold each of the exposed lateral extensions 22 of the backing. Such rotatable targets 10 are also well known in the art.

Figure 2:
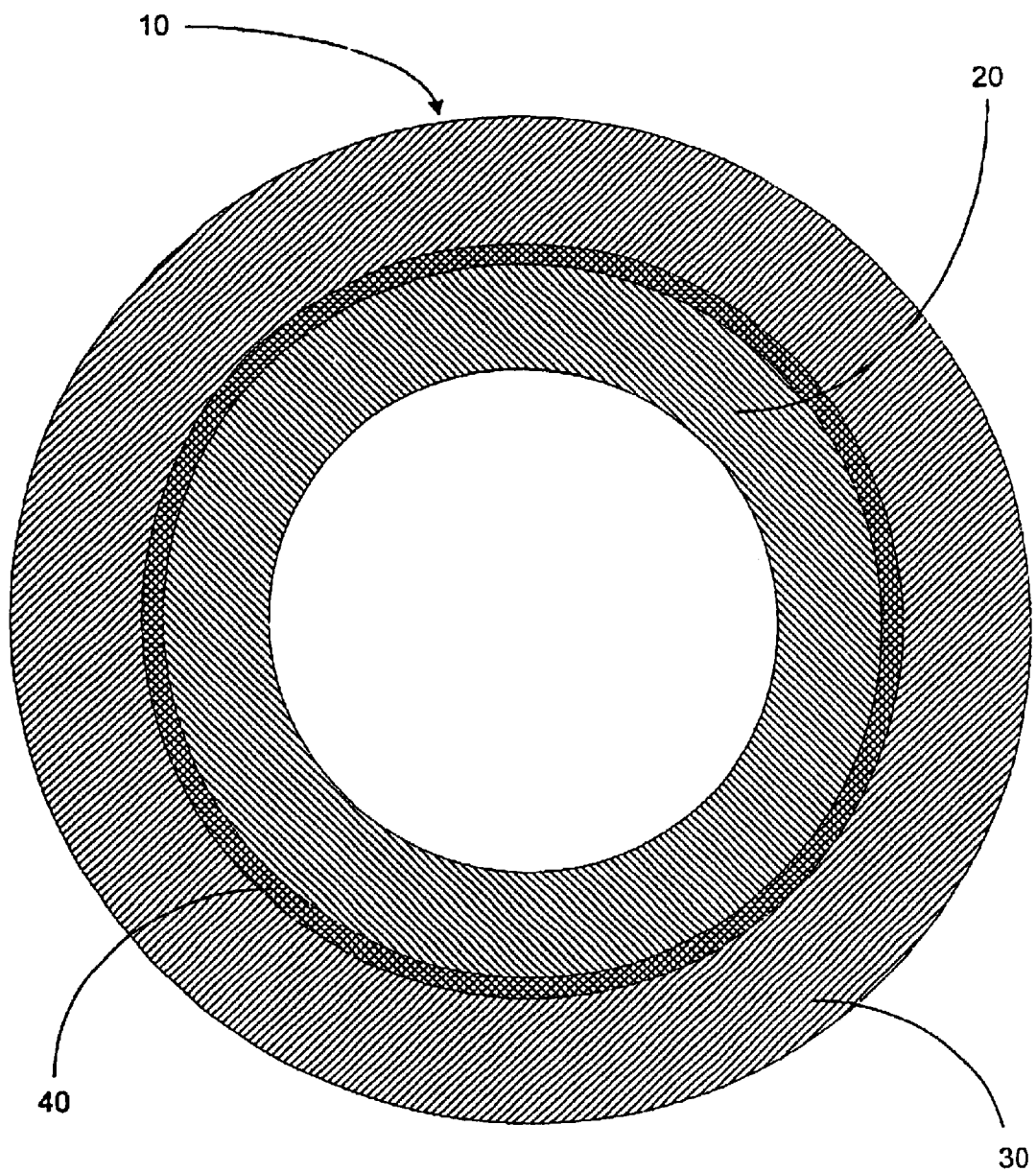
FIG. 2 is a schematic cross-sectional view of a portion of such a target.

Turning to FIG. 2, the target 10 is shown as having a backing 20 and an outer layer 30 extending radially outwardly beyond an exterior surface of the backing. If so desired, the outer layer 30 may be applied directly to the backing. In the illustrated embodiment, though, a relatively thin bonding layer 40 is positioned between the backing and the outer layer 30 of sputterable material. The bonding layer helps insure that the outer layer is securely adhered to the backing. The bonding layer should be conductive and ideally has a coefficient of thermal expansion between that of the backing and the sputterable material. In one preferred embodiment of the present invention, this bonding layer comprises nickel with up about 5% aluminum.

The sputterable material 30 comprises a mixture of zinc and a second metal having a melting point less than that of the zinc. Zinc has a melting point of about 420° C. It is preferred that the second metal have a melting point below about 400° C., but be solid at room temperature. Ideally, the second metal remains solid during all temperatures the target would encounter during ordinary operation so the second metal does not melt and physically drip from the target. It is preferred that the metal have a melting point of at least about 100° C., and more preferably 125° C. or more. The second metal may be either a single element or may comprise an alloy or admixture of two or more metals. The melting point of the alloy or each component of the admixture desirably has a melting point less than that of zinc, optimally having a melting point falling in the range of about 100–400° C.

If the target 10 of the invention is to be used in making a thin optical film, the optical properties of the layer deposited using the second metal should also be taken into consideration. In most circumstances, it is expected that a target of the invention utilizing zinc as the first metal will be sputtered in a reactive atmosphere of oxygen and/or nitrogen to deposit a layer of zinc oxide, zinc nitride or zinc oxynitride, as the case may be. In selecting the second metal for use with the zinc, one should consider the effect of the optical properties of the second metal on the resultant film stack.

In one preferred embodiment, the reaction product of the second metal has an index of refraction approximating that of the index of refraction of the reaction product from the zinc in the sputterable material. For example, zinc oxide has an index of refraction of about 2.02. There are at least three metals commonly utilized in forming thin optical films which have a melting point less than that of zinc and which form oxides having an index of refraction around 2.0—tin has a melting point of about 232° C. and tin oxide has an index of refraction of about 2.05; bismuth has a melting point of about 271° C. and bismuth oxide (typically $Bi_2O_3$) has an index of refraction closer to about 2.1; and indium has a melting point of about 157° C. and indium oxide typically has an index of refraction of about 2.03.

Hence, in a preferred embodiment, the second metal used in the outer layer 30 of the target 10 comprises tin, bismuth, indium or alloys or admixtures of tin, bismuth, and/or indium. In a particularly preferred embodiment, the second metal of the target comprises bismuth or an alloy or admixture thereof. If so desired, the second metal may consist essentially of bismuth or of tin.

The relative proportions of the zinc in the second metal can be varied as desired. It is preferred that the zinc content of the sputterable material be maintained relatively high to gain the sputtering advantages of zinc, but the second metal should be present in an amount efficacious to greatly limit, and ideally substantially eliminate, the tendency of the zinc to create "fireflies" during sputtering. Toward this end, it is preferred that the sputterable material of the outer layer 30 of the target comprise no less than 80 wt. % Zn and no less than 5% of the second metal and may preferably comprise no less than 91 wt. % Zn. In one preferred embodiment, the sputterable material comprises 80–95 wt. % Zn and 5–20 wt. % of the second metal. One target which has been found to work well comprises about 87.5% Zn and about 12.5% bismuth and it is believed that a target comprising about 94% zinc and about 6% bismuth may yield even better results.

Others have proposed forming sputtering targets out of alloys of different materials. While the second metal used in the present target may itself be an alloy, it is preferred that the second metal not be alloyed with the zinc of the target. Instead, both the zinc and the second metal are present in the outer layer 30 of sputterable material in metallic form. In particular, it is preferred that the second metal be located in discrete volumes scattered relatively uniformly throughout the outer layer 30. The relative volume taken up by the second metal in the outer layer will depend in part on the relative amounts of zinc in the second metal used in forming the target. As it is anticipated that zinc will comprise at least about 80 wt. % of the sputterable material, zinc will comprise the majority of that material. Accordingly, the discrete volumes of the second metal may be thought of as being arranged in a matrix of the predominant component of the sputterable material, i.e., zinc.

In many prior art techniques by which one may form metal sputtering targets, the metal or metals of which the target is made are melted or poured into a mold or the like to cast the target. If a multi-component target is being made, the metals of the target will tend to form an alloy, at least to the extent that the metals are soluble in one another. As noted above, U.S. Pat. No. 4,610,771 (Gillery et al.) suggests the use of an alloy of zinc and tin as a target. In such an alloy, the zinc and tin would not tend to form discrete volumes of tin in a zinc matrix. To the contrary, if the tin and zinc were in an alloy, as stated, they likely would be in a solid solution which is fairly homogenous at any level above an atomic level. While Gillery et al. do not teach in this reference how to make such a target, it is assumed that forming such a target may be made by melting the zinc and tin together and pouring the molten metal into a mold.

In contrast, the present invention provides a method of making a target which utilizes plasma spraying. While the ensuing discussion refers to FIGS. 1 and 2 for purposes of illustrating the process, it is to be understood that the process need not be limited to the structures illustrated in these drawings or to the precise description thereof set forth above. For example, the target made in accordance with this method may take the form of a planar target rather than the rotary target shown in FIG. 1.

In making a target of the invention, a backing 20 of a desired size and shape is provided. If so desired, the exterior surface of the backing can be prepared to ensure good bonding of the sputterable material thereto. For example, the external surface of the backing can be roughened by physically scoring or abrading the surface with a grinding tool or by sandblasting the surface. It may also be necessary or advisable to precoat the backing with one or more bonding layers 40, e.g., by applying a layer or layers of metal which are plasma sprayed onto the external surface of the backing. As noted above, the bonding layer(s) are desirably formed of a conductive material having a coefficient of thermal expansion between that of the backing 20 and the sputterable material of the outer layer 30. Such bonding layers may be used in lieu of roughening the surface of the backing or in conjunction therewith.

Once the backing 20 has been suitably prepared (if necessary), the outer layer can be applied by plasma spraying the outer layer 30 onto the backing. In conventional plasma spraying, the material to be sprayed is delivered to a stream of a high temperature plasma gas which will very rapidly melt the material and spray the molten material toward the backing. To limit the oxidation of the first metal (i.e., zinc in the present example) and the second metal, the gas used in generating the plasma is desirably either inert (e.g., argon) or reducing (e.g., argon with hydrogen). For example, a gas comprising about ⅔ argon and about ⅓ hydrogen has been found to work well.

The first metal and the second metal may also be plasma sprayed using water plasma spraying. In water plasma spraying, a smooth tubular stream of water is produced using a high pressure water source. The plasma is established within the confines of this water stream and the water serves to confine the plasma therewithin. This focuses the plasma energy and can facilitate faster plasma spraying rates.

Optimally, during the plasma spraying to form the outer layer 30, the backing 20 is rotated about its axis in front of a stationary plasma spray nozzle. It is also anticipated that the target will be cooled, e.g., via circulating water through the backing, to quickly quench the molten metal droplets being plasma sprayed and to protect the backing from overheating.

The first and second metals can be delivered to the plasma for spraying in any suitable fashion. Most commonly, the metals will be provided either from separate wire stock or as finely divided powders. If separate wire stock is used, the plasma will rapidly melt the length of wire fed into the plasma and spray individual droplets blown from the end of the wire toward the backing. If finely divided powders are used, each of the first and second metals may be separately delivered to the plasma stream from separate nozzles. The individual particles of the powders will tend to melt then crystallize relatively independently upon striking the cooled target. Hence, it may be possible for the powders to be mixed together and delivered to the plasma as one powder stream, with individual droplets crystallizing relatively independently to yield a sputterable material exhibiting discrete volumes of the second metal in a matrix of the first metal.

If so desired, one of the materials (e.g., zinc) may be delivered as a powder while the other material may be supplied as a metal wire (e.g., a wire formed of tin, bismuth, indium or an alloy thereof. If the second metal is provided as an admixture of tin, bismuth or indium with another metal (as opposed to an alloy thereof), this may be accomplished either by using a mixed metal powder of the desired composition, by feeding separate wires at the desired rate, or some combination thereof Using such an admixture as the second metal likely will result in separate discrete volumes of each component of the admixture being incorporated in the target. For example, if the second metal is an admixture of tin and indium, one discrete volume in the zinc matrix may consist essentially of tin while an adjacent discrete volume may consist essentially of indium.

The composition of the sputterable material can be controlled by appropriately controlling the raw material fed to the plasma spraying apparatus. For example, if separate zinc and bismuth wires of known diameter were used as raw materials, the linear rate at which each wire is fed into the plasma can be controlled to yield a sputterable material of 80–95 wt. % Zn and 5–20% Bi.

As noted above, the present invention also contemplates a method of depositing a film on a substrate. This method employs a target comprising a backing and an outer layer of a sputterable material carried by the backing, the sputterable material comprising a mixture of zinc and a second metal having a melting point less than that of the zinc. As described above, the zinc and the second metal optimally are present in the sputterable material in metallic form and arranged as discrete areas of the second metal in a matrix of zinc.

The target and a substrate are placed in a sputtering chamber and the target is operatively connected to a power source. In a conventional magnetron sputtering process. which employs a magnetic field to control the sputtering plasma, a substrate is placed within a coating chamber in facing relation with a target 10. Preferred substrates in accordance with the present invention include glass, ceramics and plastics which are not detrimentally affected by the operating conditions of the coating process.

Power is applied to the target while maintaining in the sputtering chamber a controlled atmosphere. The nature of this atmosphere will vary depending on the nature of the desired coating. If a metallic layer is desired, the target would be sputtered in an inert atmosphere, typically argon. In one method of the invention, the atmosphere maintained in the sputtering chamber includes oxygen, e.g. 80% Ar/20% $O_2$. thereby depositing on a surface of the substrate a film comprising oxides of zinc and the second metal. If nitrides of zinc and the second metal were desired, the atmosphere in the sputtering chamber could instead comprise nitrogen (e.g., 80% Ar 20% $N_2$). As will be readily apparent to one skilled in this field, other reactive gases could be used to deposit other desired materials on the substrate.

If the target 10 is to be used to apply the base layer of a film stack, the target may be sputtered directly onto the glass or other material comprising the substrate. If the coating of the invention is to be a later layer in a multiple-layer film stack, though, the substrate positioned below the target may already include one or more thin films on the upper surface thereof.

For example, a multiple layer film stack may be deposited by sputtering to form a high transmittance, low emissivity coating comprising a first dielectric layer, a reflective metal layer, and a second dielectric layer, with each dielectric layer comprising oxides of zinc and the second metal. In addition to the target 10 of the invention, at least one other target is provided, with that target comprising the metal to be sputtered to form the reflective metallic layer. A clean glass substrate may be placed in a coating chamber which is evacuated, preferably to less than $10^{-4}$ torr, more preferably less than $2 \times 10^{-5}$ torr. A selected atmosphere of inert and reactive gases, preferably argon and oxygen, is established in the chamber to a pressure between about $5 \times 10^{-4}$ and $10^{-2}$ torr. A target 10 of the invention having an outer layer comprising a mixture of zinc and said second metal is provided over the surface of the substrate to be coated. The target 10 is sputtered, reacting with the atmosphere in the chamber to deposit on the glass surface a coating layer comprising oxides of zinc and the second metal. After the initial dielectric layer is deposited, the coating chamber is evacuated (or the substrate may be moved to a second chamber, which is then evacuated) and an inert atmosphere such as pure argon is established at a pressure between about $5 \times 10^{-4}$ and $10^{-2}$ torr. A cathode having a target surface of silver metal is provided over the substrate's dielectric-coated surface. A second layer of the dielectric oxide is deposited on the silver layer under essentially the same conditions used to deposit the first dielectric oxide layer.

As noted above, the target 10 described above optimally includes discrete volumes of the second metal in a matrix of zinc. As this target is sputtered, the outer surface of the target will tend to be sputtered away, exposing the area of the target immediately therebeneath. Sputtering of the target, therefore, consumes said discrete areas of zinc and said second metal. Focusing on a localized area of the target, this sputtering will thereby expose areas of said second metal previously covered by zinc and expose areas of zinc previously covered by said second metal as the target is consumed. Since the discrete volumes of the second material are optimally distributed relatively evenly throughout the sputterable material, such variances in one localized area of the target surface will be offset by other areas of the target surface sputtering the other component, yielding a fairly consistent, homogenous dielectric coating on the substrate.

While a preferred embodiment of the present invention has been described, it should be understood that various changes, adaptations and modifications may be made therein without departing from the spirit of the invention and the scope of the appended claims.

What is claimed is:

1. A sputtering target, comprising:
   a) a backing adapted to be operatively connected to a sputtering power source; and
   b) an outer layer of a sputterable material carried by the backing, the sputterable material comprising a mixture of zinc and a second metal having a melting point less than that of the zinc, the zinc and the second metal being present in the sputterable material in metallic form and arranged as discrete volumes of the second metal in a matrix of zinc so that the zinc and the second metal are present in the sputterable material in a substantially non-alloyed form.

2. The target of claim 1 wherein the backing is generally cylindrical in shape and has an external surface, the sputterable material extending radially outwardly beyond the external surface of the backing.

3. The target of claim 1 wherein the second metal is selected from the group consisting of tin, bismuth, indium, alloys thereof, and admixtures thereof.

4. The target of claim 1 wherein the second metal comprises one of bismuth, an alloy thereof, and an admixture thereof.

5. The target of claim 1 wherein the second metal consists essentially of bismuth.

6. The target of claim 1 wherein the sputterable material comprises no less than 80 weight percent zinc.

7. The target of claim 1 wherein the sputterable material comprises no less than 91 weight percent zinc.

8. The target of claim 1 further comprising a bonding layer positioned between the backing and the sputterable material, the bonding layer comprising a conductive material.

9. A method of forming a sputtering target, comprising:
   a) providing a backing having an exterior surface; and
   b) simultaneously plasma spraying zinc metal and a second metal, said zinc metal and said second metal existing in a substantially non-alloyed form, to create an outer layer of a sputterable material carried by the backing, the second metal having a melting point less than that of the zinc metal.

10. The method of claim 9 wherein the second metal is selected from the group consisting of tin, bismuth, indium, alloys thereof, and admixtures thereof.

11. The method of claim 9 wherein the second metal comprises one of bismuth, an alloy thereof, and an admixture thereof.

12. The method of claim 9 wherein the second metal consists essentially of bismuth.

13. The method of claim 9 wherein the zinc and the second metal are delivered from discrete sources, whereby said outer layer of sputterable material comprises discrete volumes of the second metal in a matrix of zinc.

14. The method of claim 13 wherein the zinc is delivered as one of a powder and a wire.

15. The method of claim 9 wherein the zinc and the second metal are delivered at different rates to maintain the composition of the sputterable material at no less than 80 weight percent zinc.

16. The method of claim 15 wherein the zinc and the second metal are delivered to yield a sputterable material having no less than 91 weight percent zinc.

17. The method as in claim 9, further comprising a step, performed before step b), of providing at least one of said zinc metal and said second metal in a powder form.

18. The method as in claim 9, further comprising a step, performed before step b), of providing at least one of said zinc metal and said second metal in a wire form, wherein, if both of said zinc metal and said second metal are provided in said wire form, said zinc metal and said second metal are separately provided in said wire form.

19. A method of depositing a film on a substrate, comprising:
   a) providing a target comprising a backing and an outer layer of a sputterable material carried by the backing, the sputterable material comprising a mixture of zinc and a second metal having a melting point less than that of the zinc, the zinc and the second metal being present in the sputterable material in metallic form and arranged as discrete areas of the second metal in a matrix of zinc so that the zinc and the second metal are present in the sputterable material in a substantially non-alloyed form;

b) placing the target and a substrate in a sputtering chamber and connecting the target to a power source; and c) applying power to the target while maintaining in the sputtering chamber a reactive atmosphere comprising oxygen, thereby depositing on a surface of the substrate a film comprising oxides of zinc and the second metal.

20. The method of claim 19 wherein sputtering of the target consumes said discrete areas of zinc and said second metal, thereby exposing areas of said second metal previously covered by zinc and exposing areas of zinc previously covered by said second metal.

21. The method of claim 19 wherein said step of providing the target comprises forming the target by simultaneously plasma spraying from discrete sources zinc metal and a second metal to create said outer layer of sputterable material.

22. A sputtering target, comprising:

a) a backing adapted to be operatively connected to a sputtering power source; and b) an outer layer of a sputterable material carried by the backing, the sputterable material comprising a mixture of zinc and a second metal having a melting point less than that of the zinc, the zinc and the second metal being present in the sputterable material in metallic form and arranged as discrete volumes of the second metal in a matrix of zinc so that said sputterable material is substantially inhomogeneous at a level above an atomic level.

\* \* \* \* \*